(12) United States Patent
Konomi

(10) Patent No.: US 9,881,121 B2
(45) Date of Patent: Jan. 30, 2018

(54) VERIFICATION METHOD OF MASK PATTERN, MANUFACTURING METHOD OF A SEMICONDUCTOR DEVICE AND NONTRANSITORY COMPUTER READABLE MEDIUM STORING A MASK PATTERN VERIFICATION PROGRAM

(71) Applicant: Toshiba Memory Corporation, Minato-ku (JP)

(72) Inventor: Kenji Konomi, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 70 days.

(21) Appl. No.: 14/979,668

(22) Filed: Dec. 28, 2015

(65) Prior Publication Data

US 2017/0068770 A1     Mar. 9, 2017

Related U.S. Application Data

(60) Provisional application No. 62/216,001, filed on Sep. 9, 2015.

(51) Int. Cl.
*G06F 17/50*     (2006.01)
*G03F 1/70*     (2012.01)

(52) U.S. Cl.
CPC .......... *G06F 17/5081* (2013.01); *G03F 1/70* (2013.01); *G06F 17/5009* (2013.01)

(58) Field of Classification Search
CPC .................................................. G06F 17/5081
USPC ........................................................... 716/51
See application file for complete search history.

(56) References Cited

U.S. PATENT DOCUMENTS

| | | | |
|---|---|---|---|
| 8,127,265 B2 | 2/2012 | Ogawa et al. | |
| 2007/0109930 A1* | 5/2007 | Okamoto | G11B 7/094 369/44.37 |
| 2009/0265673 A1* | 10/2009 | Avanessian | G06F 17/5081 716/106 |
| 2015/0254393 A1* | 9/2015 | Fujimura | H01J 37/3175 250/492.22 |

FOREIGN PATENT DOCUMENTS

| | | |
|---|---|---|
| JP | 3482172 | 12/2003 |
| JP | 2009-14790 | 1/2009 |
| JP | 4744980 | 8/2011 |

* cited by examiner

*Primary Examiner* — Suchin Parihar
(74) *Attorney, Agent, or Firm* — Oblon, McClelland, Maier & Neustadt, L.L.P.

(57) ABSTRACT

According to one embodiment, an inscribed figure as circle or an oval inscribed in a rectangular pattern of designed layout data is calculated, a difference in area between a lithographic shape corresponding to the rectangular pattern and the inscribed figure is calculated, and it is determined whether the difference in area satisfies a predetermined specification.

20 Claims, 12 Drawing Sheets

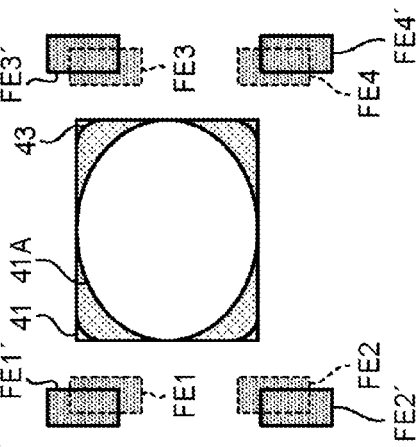
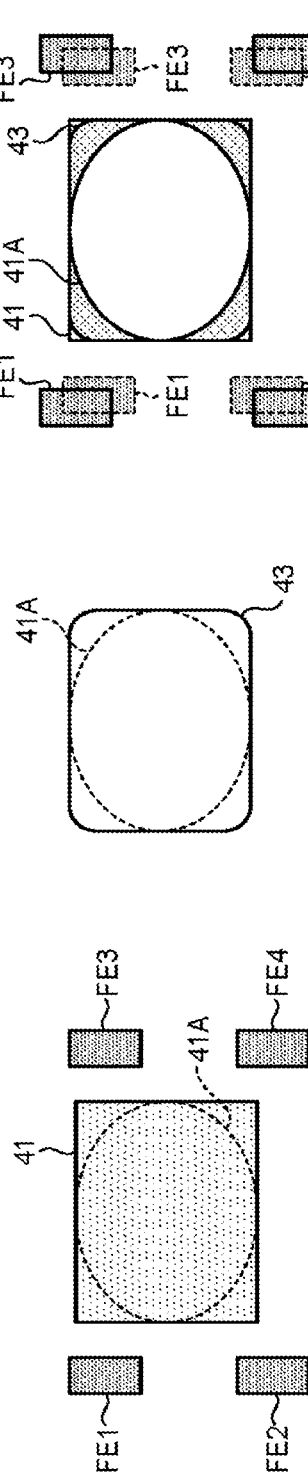
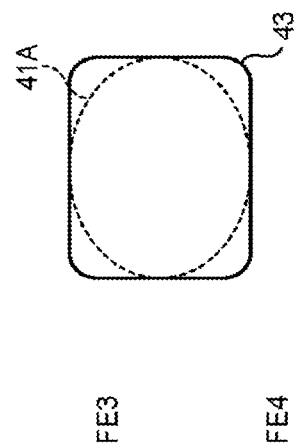
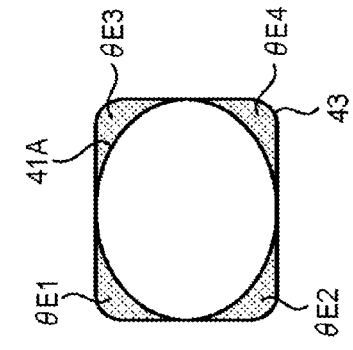
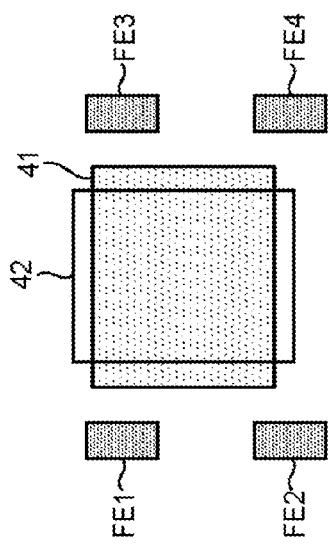
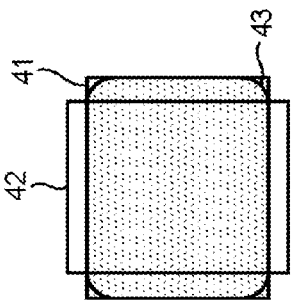

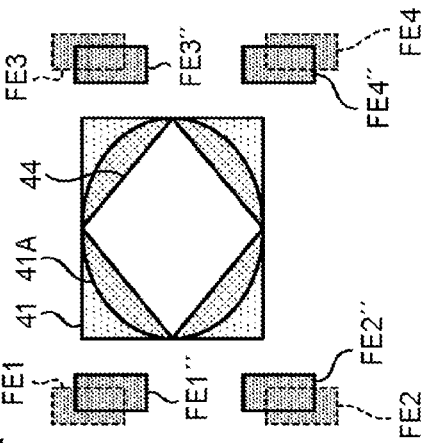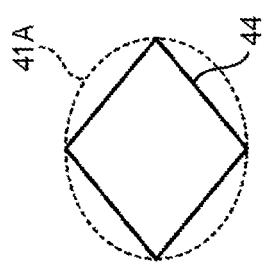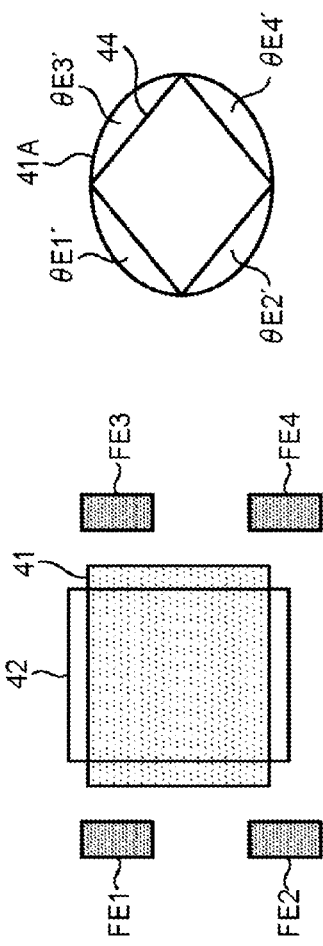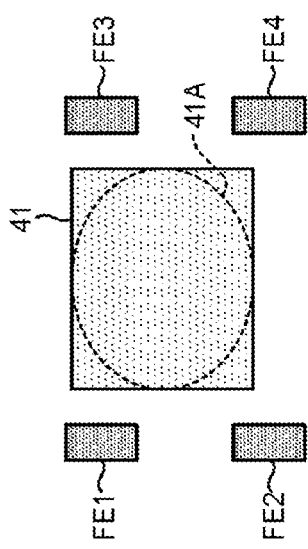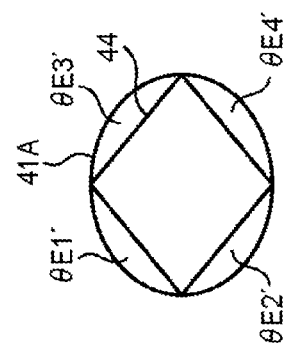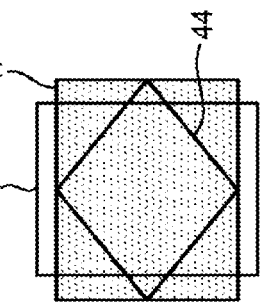

VERIFICATION METHOD OF MASK PATTERN, MANUFACTURING METHOD OF A SEMICONDUCTOR DEVICE AND NONTRANSITORY COMPUTER READABLE MEDIUM STORING A MASK PATTERN VERIFICATION PROGRAM

This application is based upon and claims the benefit of priority from U.S. Provisional Application No. 62/216,001, filed on Sep. 9, 2015; the entire contents of which are incorporated herein by reference.

FIELD

Embodiments described herein relate generally to a verification method of a mask pattern, a manufacturing method of a semiconductor device, and a nontransitory computer readable medium storing a mask pattern verification program.

BACKGROUND

In a process for manufacturing a semiconductor device, it is verified in simulation whether a resist pattern after lithography matches a designed layout pattern.

BRIEF DESCRIPTION OF THE DRAWINGS

FIGS. 8A to 8F are plane views illustrating a verification method of a mask pattern and a correction method of a mask pattern according to a fifth embodiment;

FIGS. 9A to 9F are plane views illustrating a verification method of a mask pattern and a correction method of a mask pattern according to a sixth embodiment;

DETAILED DESCRIPTION

In general, according to one embodiment, an inscribed figure as a circle or an oval inscribed in a rectangular pattern of designed layout data is calculated, a difference in area between a lithographic shape corresponding to the rectangular pattern and the inscribed figure is calculated, and it is determined whether the difference in area satisfies a predetermined specification.

Exemplary embodiments of a verification method of a mask pattern and a manufacturing method of semiconductor device will be explained below in detail with reference to the accompanying drawings. The present invention is not to the following embodiment.

First Embodiment

Figure 1:
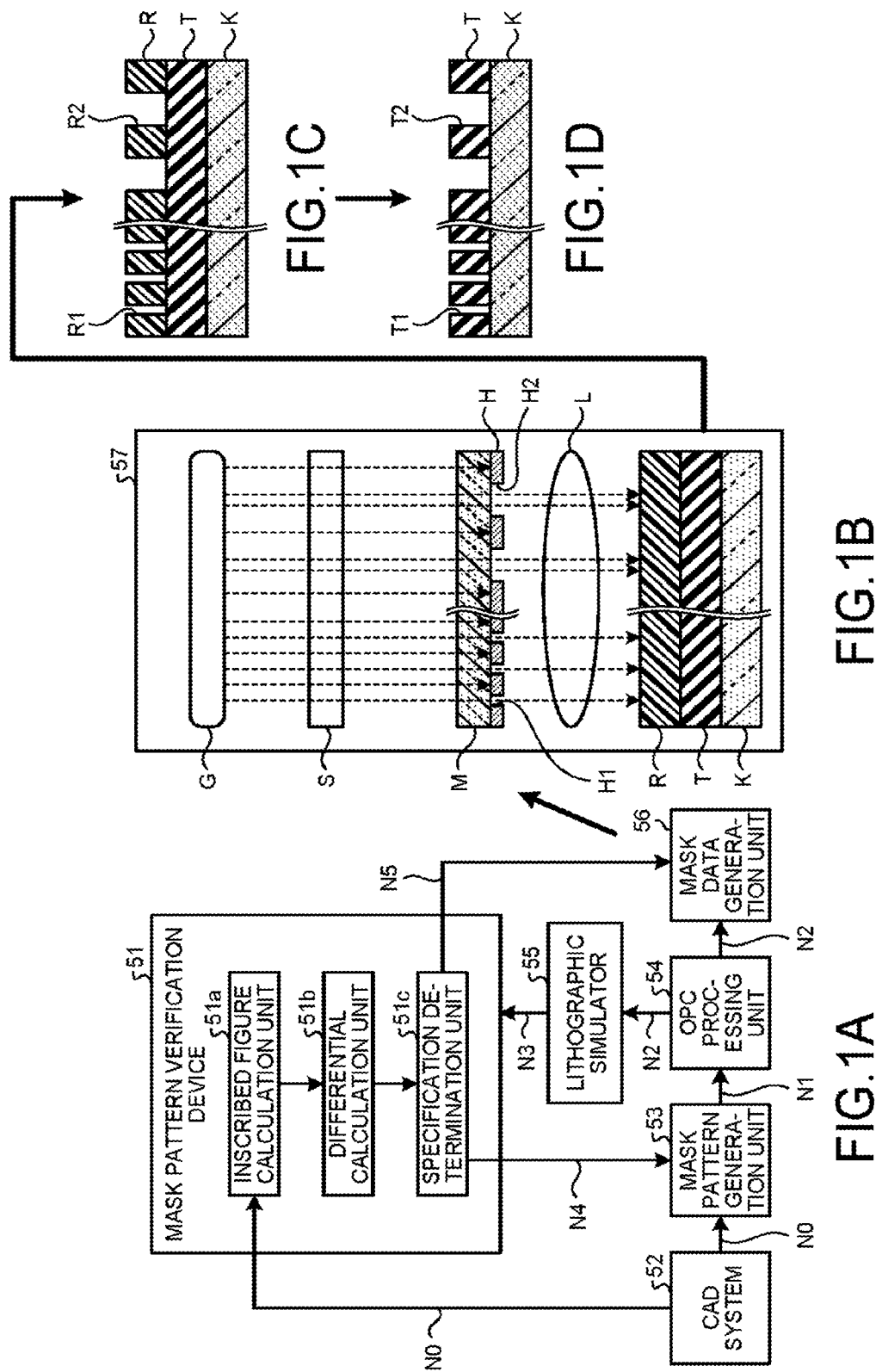
FIG. 1A is a schematic block diagram of a mask pattern verification device and its peripherals according to a first embodiment.
FIG. 1B is a schematic cross-sectional view of an exposure apparatus in which the mask pattern verification device illustrated in FIG. 1A is used.
FIG. 1C is a cross-sectional view illustrating a process after formation of a resist pattern.
FIG. 1D is a cross-sectional view illustrating a process after formation of a post-process pattern.

FIG. 1A is a schematic block diagram of a mask pattern verification device and its peripherals according to a first embodiment, FIG. 1B is a schematic cross-sectional view of an exposure apparatus in which the mask pattern verification device illustrated in FIG. 1A is used, FIG. 1C is a cross-sectional view illustrating a process after formation of a resist pattern, and FIG. 1D is a cross-sectional view illustrating a process after formation of a post-process pattern.

Referring to FIG. 1A, a mask pattern verification device 51 is provided with an inscribed figure calculation unit 51a, a differential calculation unit 51b, and a specification determination unit 51c. The peripherals of the mask pattern verification device 51 include a CAD system 52, a mask pattern generation unit 53, an OPC processing unit 54, a lithographic simulator 55, and a mask data generation unit 56. Referring to FIG. 1B, an exposure apparatus 57 is provided with a light source G, a diaphragm S, a photomask M, and a lens L.

The inscribed figure calculation unit 51a calculates an inscribed figure as a circle or an oval inscribed in a rectangular pattern of designed layout data N0. The differential calculation unit 51b calculates the difference between a lithographic shape corresponding to the rectangular pattern of the designed layout data N0 and the inscribed figure. The specification determination unit 51c determines whether the difference in area between the lithographic shape and the inscribed figure satisfies a predetermined specification.

In the CAD system 52, the designed layout data N0 for a semiconductor integrated circuit is generated and sent to the mask pattern generation unit 53. The mask pattern generation unit 53 generates a mask pattern N1 in which an auxiliary pattern is added to the rectangular pattern of the designed layout data N0. The auxiliary pattern may also be called SRAF (Sub Resolution Assist Features). The SRAF is formed on a mask M but is not transferred to a resist film R. The SRAF can be set to dimensions not reaching the resolution limit for exposure light.

Then, the OPC processing unit 54 makes a proximity effect correction to the mask pattern N1 to which the auxiliary pattern is added. After that, the lithographic simulator 55 performs a lithographic simulation on a mask pattern N2 after the proximity effect correction to calculate a lithographic shape N3 corresponding to the rectangular pattern of the designed layout data N0. At that time, when a lithographic simulation is performed based on the rectangular pattern of the designed layout data N0, the corners of the rectangular pattern are rounded due to scattering and interference of exposure light, thereby to obtain the lithographic shape N3 in a pattern close to a circle or an oval. The inscribed figure calculation unit 51a calculates an inscribed figure inscribed in the rectangular pattern of the designed layout data N0.

The differential calculation unit 51b calculates a difference in area between the inscribed figure inscribed in the rectangular pattern of the designed layout data N0 and the lithographic shape N3. The specification determination unit 51c determines whether the difference in area between the inscribed figure inscribed in the rectangular pattern of the designed layout data N0 and the lithographic shape N3 satisfies a predetermined specification. Then, when the difference in area between the inscribed figure inscribed in the rectangular pattern of the designed layout data N0 and the lithographic shape N3 does not satisfy the predetermined specification, a correction instruction N4 is sent to the mask pattern generation unit 53. According to the correction instruction N4, the mask pattern generation unit 53 changes the position, size, or shape of the auxiliary pattern added to the rectangular pattern of the designed layout data N0.

In contrast, when the difference in area between the inscribed figure inscribed in the rectangular pattern of the designed layout data N0 and the lithographic shape N3 satisfies the predetermined specification, an acceptance instruction N5 is sent to the mask data generation unit 56.

When the difference in area between the inscribed figure inscribed in the rectangular pattern of the designed layout data N0 and the lithographic shape N3 is smaller than a predetermined value, it is determined that the specific specification is satisfied. In contrast, when the difference in area between the inscribed figure inscribed in the rectangular pattern of the designed layout data N0 and the lithographic shape N3 is equal to or more than the predetermined value, it is determined that the predetermined specification is not satisfied.

Then, the mask data generation unit 56 generates mask data corresponding to the mask pattern N2 after the proximity effect correction. Mask patterns H1 and H2 corresponding to the mask data generated by the mask data generation unit 56 are formed from a light-shielding film H on the photomask M. At that time, the mask pattern H2 can be larger in area than the mask pattern H1.

Meanwhile, as illustrated in FIG. 1B, a processing film T is formed on a foundation layer K, and a resist film R is applied to the processing film T. The foundation layer K and the processing film T may be semiconductor substrates, insulating films such as silicon oxide films or silicon nitride films, semiconductor films of amorphous silicon or multicrystalline silicon, or metal films of Al or Cu.

Then, the light source G emits exposure light such as ultraviolet light. The exposure light is focused by the diaphragm S, and then entered into the resist film R via the photomask M and the lens L to expose the resist film R to light. At that time, the shape of the exposure light can be set to obtain a desired shape for the mask pattern H1.

Next, as illustrated in FIG. 1C, after the exposure of the resist film R, the resist film R is developed to form resist patterns R1 and R2 corresponding to the mask patterns H1 and H2 on the photomask M. The resist patterns R1 and R2 can be hole patterns. The shape of the exposure light can be set such that the shape of the resist pattern R1 is a circle or an oval.

Next, as illustrated in FIG. 1D, the processing film T is processed with the resist patterns R1 and R2 to which the mask patterns H1 and H2 are transferred as masks to form the post-process patterns T1 and T2 corresponding to the resist patterns R1 and R2. The processing film T may be processed by etching or ion implantation.

In this example, by changing the position, size, or shape of the auxiliary pattern applied to the rectangular pattern of the designed layout data N0 until the difference in area between the inscribed figure inscribed in the rectangular pattern of the designed layout data N0 and the lithographic shape N3 satisfies the predetermined specification, it is possible to bring the shape of the resist pattern R2 to a circle or an oval even when the shape of the exposure light is set such that the shape of the resist pattern R1 becomes a circle or an oval.

In addition, by taking the difference in area between the inscribed figure inscribed in the rectangular pattern of the designed layout data N0 and the lithographic shape N3, it is possible to improve the accuracy of determining whether the lithographic shape N3 is a circle or an oval as compared to the case where it is determined whether there is a match in evaluation points between the rectangular pattern of the designed layout data N0 and the lithographic shape N3.

FIGS. 2A to 2F are plane views illustrating the verification method of a mask pattern and a correction method of a mask pattern according to the first embodiment.

Figure 2:
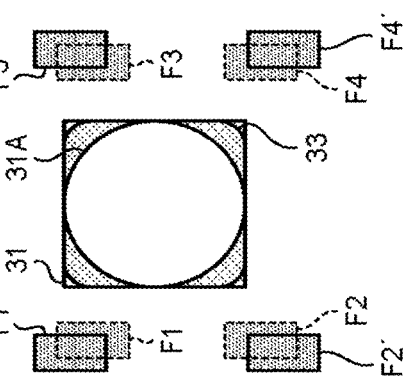
FIGS. 2A to 2F are plane views illustrating the verification method of a mask pattern and a correction method of a mask pattern according to the first embodiment.

Referring to FIG. 2A, auxiliary patterns F1 to F4 are added to a rectangular pattern 31 in the designed layout data N0. The auxiliary patterns F1 to F4 can be arranged adjacent to the four corners of the rectangular pattern 31. To add the auxiliary patterns to the rectangular pattern not only the auxiliary patterns may be arranged adjacent to the four corners of the rectangular pattern 31, but also the auxiliary patterns may be arranged adjacent to the sides of the rectangular pattern 31, or may be combined to be arranged adjacent to the corners of the rectangular pattern 31 and to the sides of the rectangular pattern 31. When the rectangular pattern 31 is a square, an inscribed circle 31A can be obtained as an inscribed figure of the rectangular pattern 31.

Next, as illustrated in FIG. 2B, a proximity effect correction is performed on the rectangular pattern 31 to generate a rectangular pattern 32. FIG. 2B illustrates an example in which a proximity effect correction is performed to cancel the inclination of exposure light.

Next, as illustrated in FIG. 2C, a lithographic simulation is performed on the rectangular pattern 32 to which the auxiliary patterns F1 to F4 are added to calculate a lithographic shape 33. The lithographic shape 33 refers to a resist pattern formed on a resist film when the resist film is exposed to light with the rectangular pattern 32 to which the auxiliary patterns F1 to F4 are added as masks. The lithographic shape 33 can be calculated by causing a computer to execute the lithographic simulation.

Next, as illustrated in FIG. 2D, the lithographic shape 33 is arranged in contact with the inscribed circle 31A at four points. At that time, the inscribed circle 31A can be inscribed in the lithographic shape 33. As illustrated in FIG. 2E, four regions $\theta 1$ to $\theta 4$ surrounded by the inscribed circle 31A and the lithographic shape 33 can be obtained. Then, the areas of the regions $\theta 1$ to $\theta 4$ are calculated, and it is determined whether the areas of the regions $\theta 1$ to $\theta 4$ satisfy a predetermined specification. When the areas of the regions $\theta 1$ to $\theta 4$ do not satisfy the predetermined specification, the auxiliary patterns F1 to F4 are changed to auxiliary patterns F1' to F4' as illustrated in FIG. 2F. At that time, the auxiliary patterns F1' to F4' can be generated by moving the auxiliary patterns F1 to F4 to be more distant from the center of the inscribed circle 31A, for example.

Figure 3:
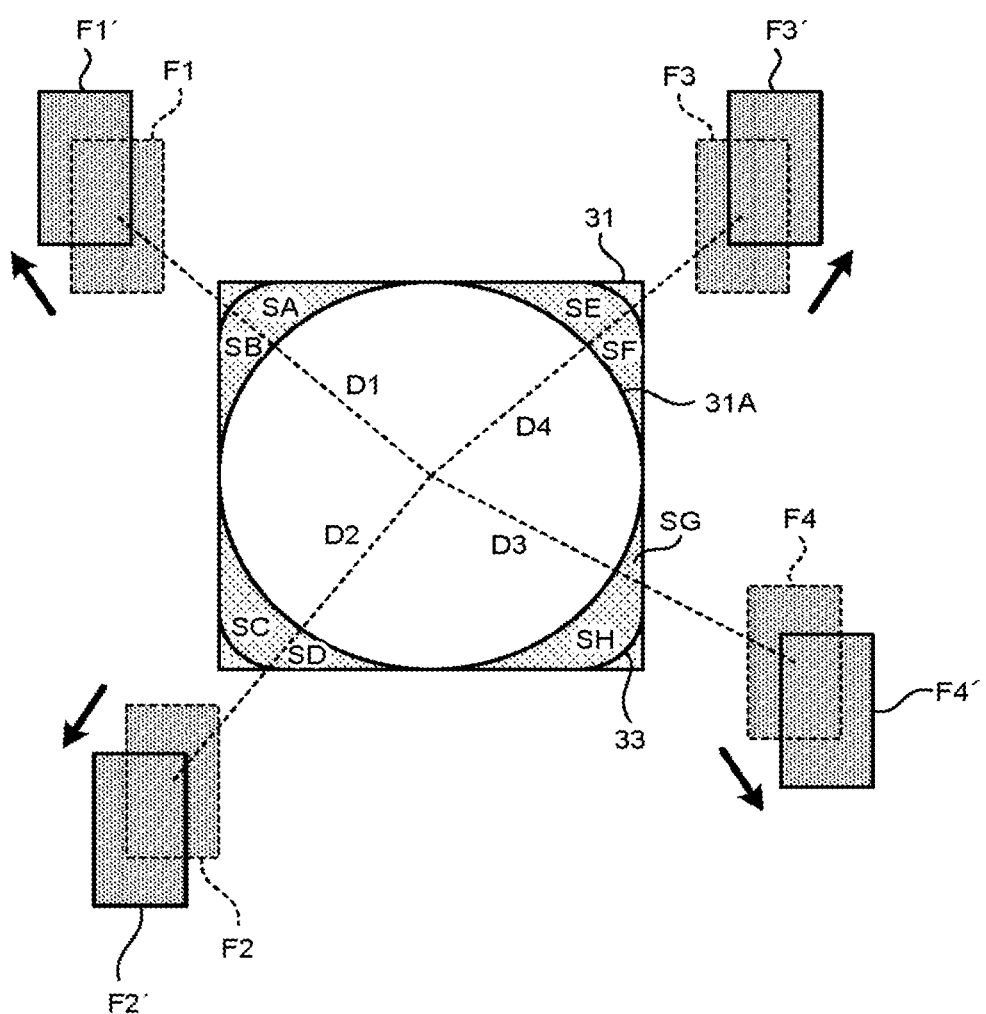
FIG. 3 is a plane view illustrating one example of the correction method of a mask pattern according to the first embodiment.

FIG. 3 is a plane view illustrating one example of the correction method of a mask pattern according to the first embodiment.

Referring to FIG. 3, the regions θ1 to θ4 illustrated in FIG. 2E are obtained. Line segments D1 to D4 linking the center of the inscribed circle 31A and the centers of the auxiliary patterns F1 to F4 are generated. Then, areas SA to SH of the regions θ1 to θ4 divided by the line segments D1 to D4 are determined. Then, based on the areas SA and SB, the amount of movement from the auxiliary pattern F1 to the auxiliary pattern F1' can be determined. Based on the areas SC and SD, the amount of movement from the auxiliary pattern F2 to the auxiliary pattern F2' can be determined. Based on the areas SE and SF, the amount of movement from the auxiliary pattern F3 to the auxiliary pattern F3' can be determined. Based on the areas SG and SH, the amount of movement from the auxiliary pattern F4 to the auxiliary pattern F4' can be determined.

Figure 4:
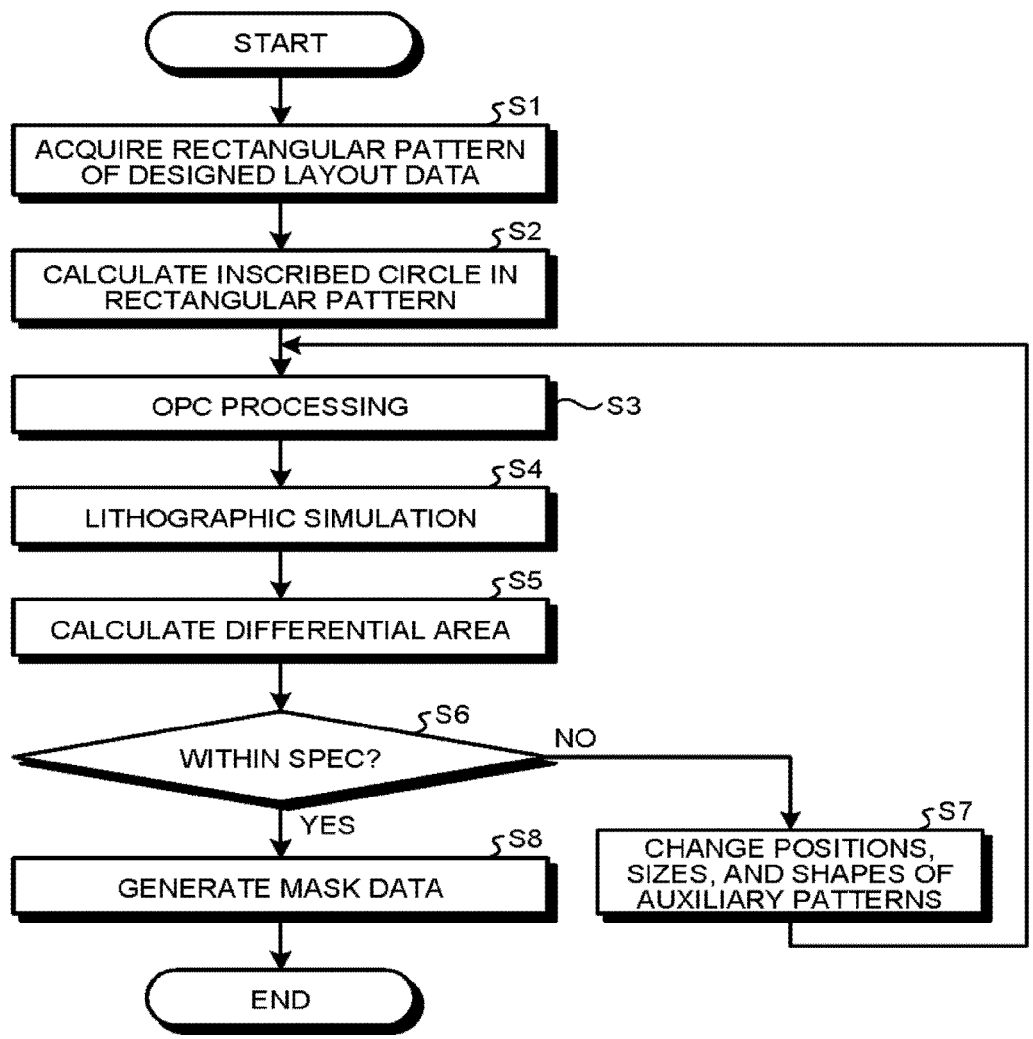
FIG. 4 is a flowchart describing the verification method of a mask pattern and the correction method of a mask pattern according to the first embodiment.

FIG. 4 is a flowchart describing the verification method of a mask pattern and the correction method of a mask pattern according to the first embodiment.

Referring to FIG. 4, a rectangular pattern of designed layout data is acquired (S1). An inscribed circle in the rectangular pattern is calculated (S2). A proximity effect correction is made to the rectangular pattern to which auxiliary patterns are added (S3). Lithographic simulation is performed on the rectangular pattern having undergone the proximity effect simulation to calculate a lithographic shape (S4). The differential area between the inscribed circle and the lithographic shape is determined when the lithographic shape is arranged in contact with the inscribed circle of the rectangular pattern at four points (S5). It is determined whether the differential area satisfies a specification (S6). When the differential area satisfies the specification, mask data is generated in correspondence with the rectangular pattern having undergone the proximity effect correction (S8). In contrast, when the differential area does not satisfy the specification, the positions, sizes, and shapes of the auxiliary patterns are changed (S7), and the process returns to S3. Then, steps S3 to S7 are repeated until the differential area satisfies the specification.

Second Embodiment

Figure 5A:
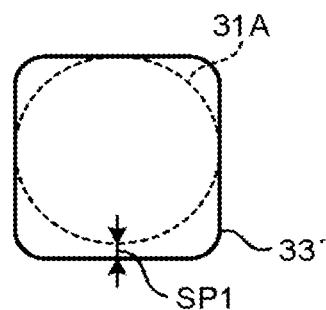
FIGS. 5A to 5C are plane views illustrating a verification method of a mask pattern according to a second embodiment.
Figure 5B:
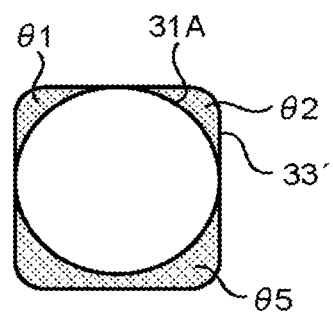
Figure 5C:
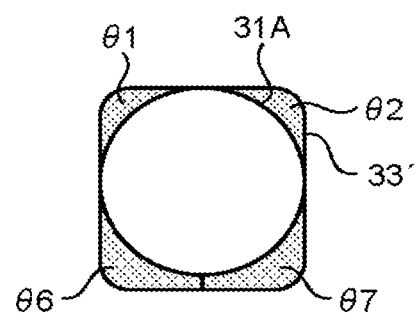

FIGS. 5A to 5C are plane views illustrating a verification method of a mask pattern according to a second embodiment.

Referring to FIG. 5A, a lithographic simulation is performed on the rectangular pattern 32 to which the auxiliary patterns F1 to F4 are added to calculate a lithographic shape 33'. The lithographic shape 33' cannot be arranged in contact with the inscribed circle 31A at four points. In this case, the lithographic shape 33' is arranged in contact with the inscribed circle 31A at three points. At that time, a space SP1 is created between one side of the lithographic shape 33' and the inscribed circle 31A. Accordingly, the regions θ2 and θ4 illustrated in FIG. 2E are connected to obtain three regions θ1, θ2, and θ5 surrounded by the inscribed circle 31A and the lithographic shape 33' as illustrated in FIG. 5B. The region θ5 is divided into regions θ6 and θ7 as illustrated in FIG. 5C. Accordingly, the four regions θ1, θ2, θ6, and θ7 can be obtained in correspondence with the four corners of the lithographic shape 33'. Then, in the case where the areas of the regions θ1, θ2, θ6, and θ7 do not satisfy a predetermined specification, when auxiliary patterns are added to the lithographic shape 33' in correspondence with the four corners, the positions, sizes, and shapes of the auxiliary patterns can be changed from the areas of the regions θ1, θ2, θ6, and θ7.

Third Embodiment

FIGS. 6A to 6F are plane views of a verification method of a mask pattern and a correction method of a mask pattern according to a third embodiment.

Figure 6F:
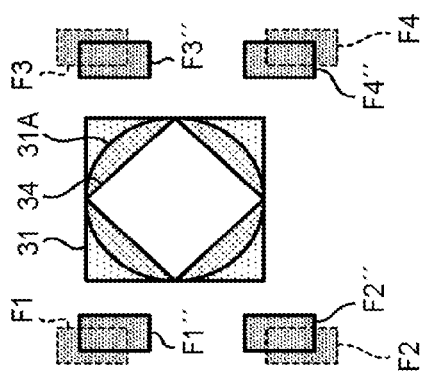
FIGS. 6A to 6F are plane views of a verification method of a mask pattern and a correction method of a mask pattern according to a third embodiment.
Figure 6D:
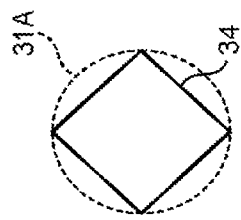
Figure 6E:
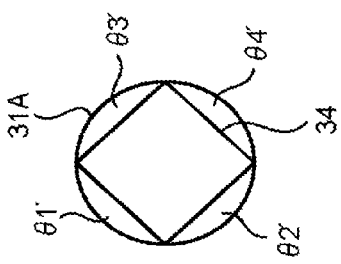
Figure 6A:
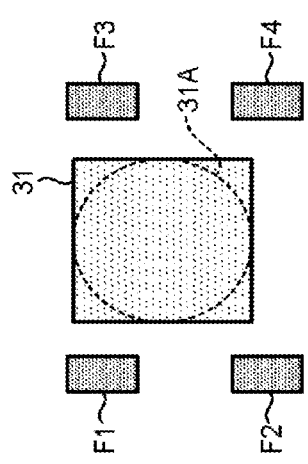
Figure 6B:
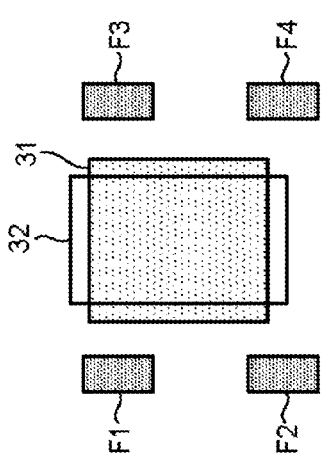
Figure 6C:
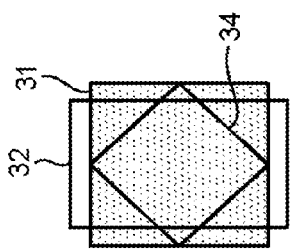

As illustrated in FIG. 6C, a lithographic simulation is performed on the rectangular pattern 32 to which the auxiliary patterns F1 to F4 are added to obtain a lithographic shape 34 instead of the lithographic shape 33 illustrated in FIG. 2C.

Then, as illustrated in FIG. 6D, the lithographic shape 34 is arranged in contact with the inscribed circle 31A at four points. At that time, the inscribed circle 31A can be circumscribed around the lithographic shape 34. Accordingly, as illustrated in FIG. 6E, four regions θ1' θ4' surrounded by the inscribed circle 31A and the lithographic shape 34 can be obtained. Then, the areas of the regions θ1' to θ4' are calculated, and it is determined whether the areas of the regions θ1' to θ4' specify a predetermined specification. When the areas of the regions θ1' to θ4' do not satisfy the predetermined specification, the auxiliary patterns F1 to F4 are changed to auxiliary patterns F1" to F4" as illustrated in FIG. 6F. At that time, the auxiliary patterns F1" to F4" can be generated by moving the auxiliary patterns F1 to F4 to be closer to the center of the inscribed circle 31A, for example.

Fourth Embodiment

Figure 7A:
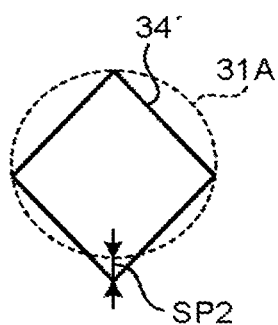
FIGS. 7A to 7C are plane views illustrating a verification method of a mask pattern according to a fourth embodiment.
Figure 7B:
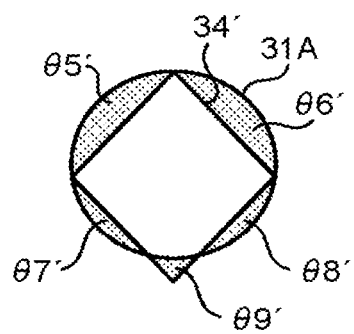
Figure 7C:
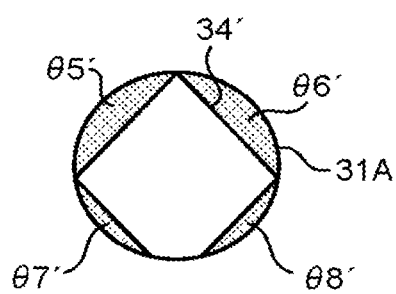

FIGS. 7A to 7C are plane views illustrating a verification method of a mask pattern according to a fourth embodiment.

Referring to FIG. 7A, a lithographic simulation is performed on the rectangular pattern 32 to which the auxiliary patterns F1 to F4 are added to calculate a lithographic shape 34'. The lithographic shape 34' cannot be arranged in contact with the inscribed circle 31A at four points. In this case, the lithographic shape 34' is arranged in contact with the inscribed circle 31A at three points. At that time, a space SP2 is created between one corner of the lithographic shape 34' and the inscribed circle 31A. Accordingly, as illustrated in FIG. 7B, five regions θ5' to θ9' surrounded by the inscribed circle 31A and the lithographic shape 34' can be obtained. At that time, the regions θ5' to θ8' are arranged inside the inscribed circle 31A, and the region θ9' extends off the inscribed circle 31A. In this example, as illustrated in FIG. 7C, the regions θ9' is removed. Accordingly, the four regions θ5' to θ8' can be obtained in correspondence with the four corners of the lithographic shape 34'. In the case where the areas of the regions θ5' to θ8' do not satisfy a predetermined specification, when the auxiliary patterns are added to the lithographic shape 34' at the four corners, the positions, sizes, and shapes of the auxiliary patterns can be changed from the areas of the regions θ5' to θ8'.

Fifth Embodiment

FIGS. 8A to 8F are plane views illustrating a verification method of a mask pattern and a correction method of a mask pattern according to a fifth embodiment.

Referring to FIG. 8A, auxiliary patterns FE1 to FE4 are added to a rectangular pattern 41 in the designed layout data N0. The auxiliary patterns FE1 to FE4 can be arranged adjacent to the four corners of the rectangular pattern 41. At that time, when the rectangular pattern 41 is rectangular, an inscribed oval 41A can be obtained as an inscribed figure in the rectangular pattern 41.

Next, as illustrated in FIG. 8B, a proximity effect correction is performed on the rectangular pattern 41 to generate a rectangular pattern 42. Then, as illustrated in FIG. 8C, a lithographic simulation is performed on the rectangular pattern 42 to which the auxiliary patterns FE1 to FE4 are added to calculate a lithographic shape 43.

Next, as illustrated in FIG. 8D, the lithographic shape 43 is arranged in contact with the inscribed oval 41A at four points. At that time, the inscribed oval 41A can be inscribed in the lithographic, shape 43. Accordingly, as illustrated in FIG. 8E, four regions θE1 to θE4 surrounded by the inscribed oval 41A and the lithographic shape 43 can be obtained. Then, the areas of the regions θE1 to θE4 are calculated, and it is determined whether the areas of the regions θE1 to θE4 satisfy a predetermined specification. When the areas of the regions θE1 to θE4 do not satisfy the predetermined specification, the auxiliary patterns FE1 to FE4 are changed to auxiliary patterns FE1' to FE4' as illustrated in FIG. 8F. At that time, the auxiliary patterns FE1' to FE4' can be generated by moving the auxiliary patterns FE1 to FE4 to be more distant from the center of the inscribed oval 41A, for example.

Sixth Embodiment

FIGS. 9A to 9F are plane views illustrating a verification method of a mask pattern and a correction method of a mask pattern according to a sixth embodiment.

Referring to FIG. 9A, a lithographic simulation is performed on the rectangular pattern 42 to which auxiliary patterns FE1 to FE4 are added to obtain a lithographic shape 44 instead of the lithographic shape 43 illustrated in FIG. 8C.

As illustrated in FIG. 9D, the lithographic shape 44 is arranged in contact with the inscribed oval 41A at four points. At that time, the inscribed oval 41A can be circumscribed around the lithographic shape 44. Accordingly, as illustrated in FIG. 9E, four regions θE1' to θE4' surrounded by the inscribed oval 41A and the lithographic shape 44 can be obtained. Then, the areas of the regions θE1' to θE4' are calculated, and it is determined whether the areas of the regions θE1' to θE4' satisfy a predetermined specification. When the areas of the regions θE1' to θE4' do not satisfy the predetermined specification, the auxiliary patterns FE1 to FE4 are changed to auxiliary patterns FE1" to FE4" as illustrated in FIG. 9F. The auxiliary patterns FE1" to FE4" can be generated by moving the auxiliary patterns FE1 to FE4 to be closer to the center of the inscribed oval 41A, for example.

Seventh Embodiment

Figure 10:
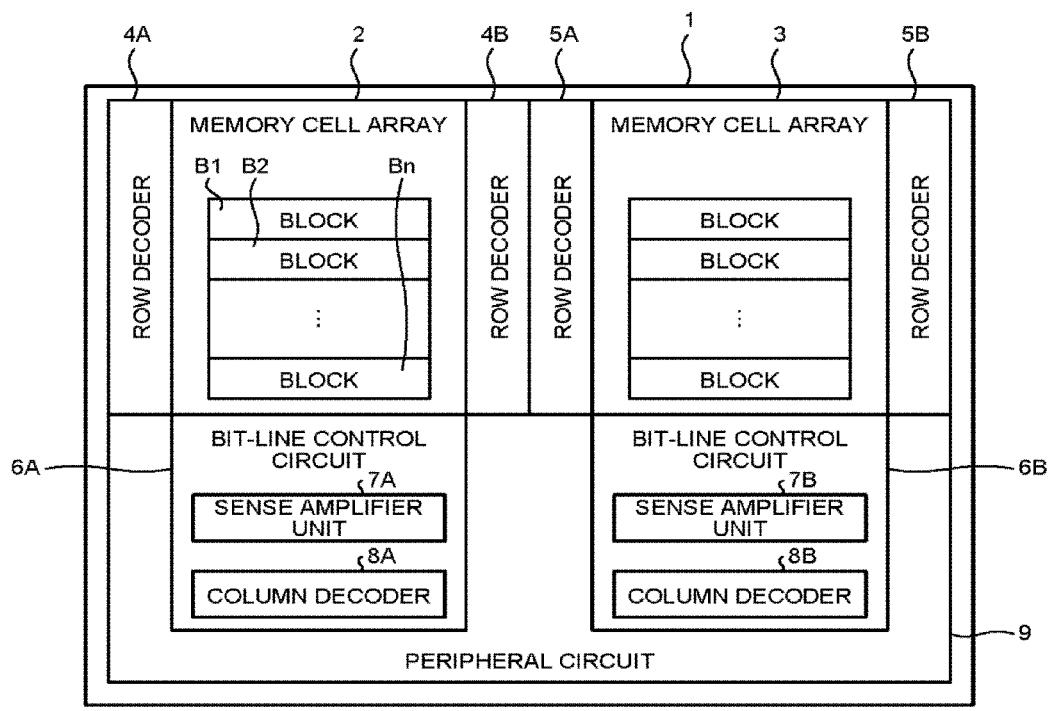
FIG. 10 is a plane view of a layout configuration of a semiconductor storage device to which a verification method of a mask pattern according to a seventh embodiment is applied.

FIG. 10 is a plane view of a layout configuration of a semiconductor storage device to which a verification method of a mask pattern according to a seventh embodiment is applied.

Referring to FIG. 10, a semiconductor chip 1 includes memory cell arrays 2 and 3 and a peripheral circuit 9. The peripheral circuit 9 includes row decoders 4A, 4B, 5A, and 5B and bit-line control circuits 6A and 6B. The row decoders 4A, 4B and the bit-line control circuit 6A are provided in correspondence with the memory cell array 2, and the row decoders 5A, 5B and the hit-line control circuit 6B are provided in correspondence with the memory cell array 3.

The bit-line control circuits 6A and 6B include sense amplifier units 7A and 7B and column decoders 8A and 8B, respectively.

Each of the memory cell arrays 2 and 3 has a matrix of memory cells storing data arranged in a row direction and a column direction. The memory cell arrays 2 and 3 are divided into n (n denotes a positive integer) blocks B1 to Bn. Each of the blocks B1 to Bn can form a unit of erasing in a NAND flash memory.

The row decoders 4A and 4B can select memory cells from the memory cell array 2 in the row direction at the time of memory cell reading, memory cell writing, and memory cell erasing. The row decoders 5A and 5B can select memory cells from the memory cell array 3 in the row direction at the time of memory cell reading, memory cell writing, and memory cell erasing. The bit-line control circuit 6A can perform bit-line control on the memory cell array 2. The bit-line control circuit 6B can perform bit-line control on the memory cell array 3. The column decoder 8A can select memory cells from the memory cell array 2 in the column direction at the time of memory cell reading, memory cell writing, and memory cell erasing. The column decoder 8B can select memory cells from the memory cell array 3 in the column direction at the time of memory cell reading, memory cell writing, and memory cell erasing. The sense amplifier unit 7A can determine the values stored in the memory cells of the memory cell array 2. The sense amplifier unit 7B can determine the values stored in the memory cells of the memory cell array 3. The peripheral circuit 9 can transfer commands and addresses received from the outside and can control operations of the row decoders 4A, 4B, 5A, 5B and the bit-line control circuits 6A, 6B according to the commands and the addresses.

Figure 11:
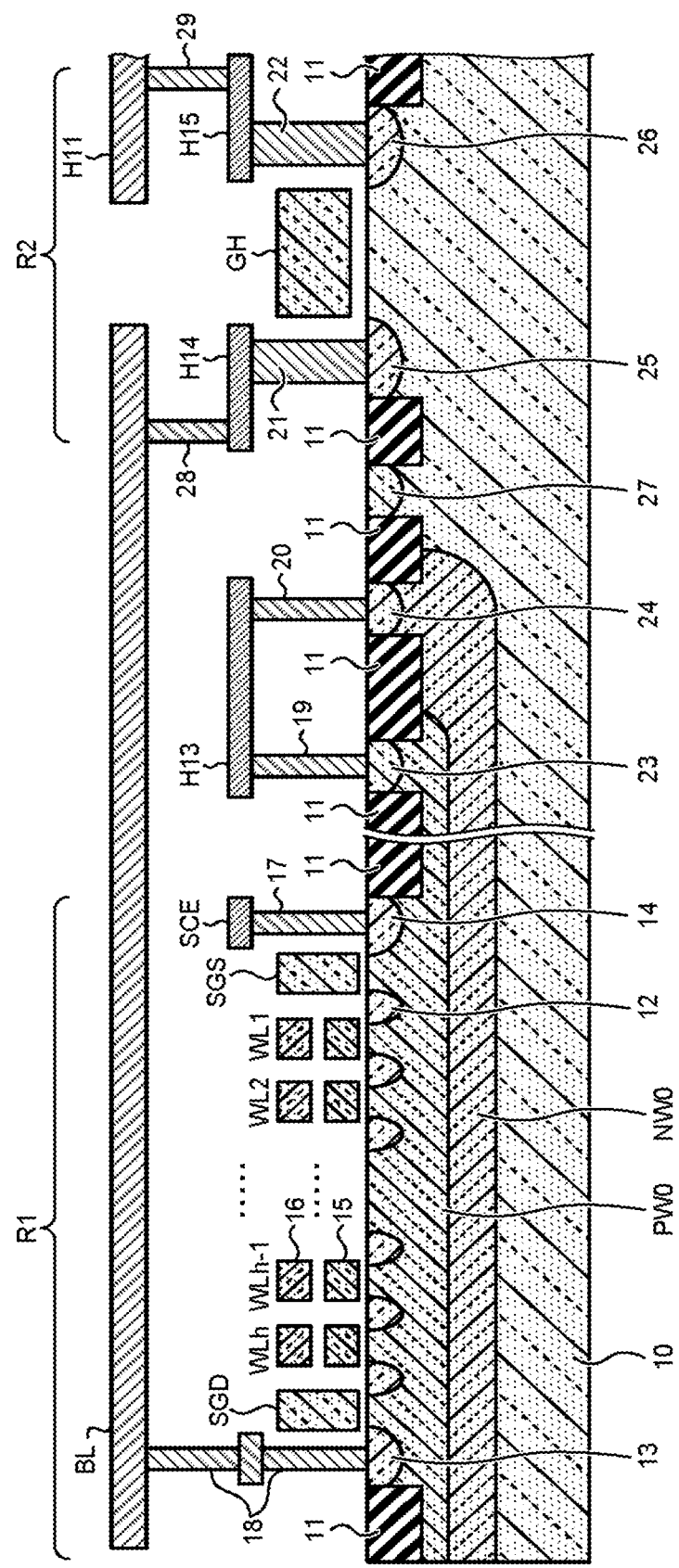
FIG. 11 is a cross-sectional view illustrating a configuration example of NAND cell units and a peripheral circuit illustrated in FIG. 10.

FIG. 11 is a cross-sectional view illustrating a configuration example of the NAND cell units and the peripheral circuit illustrated in FIG. 10.

Referring to FIG. 11, a semiconductor substrate 10 is provided with a cell array region R1 and a peripheral region R2. The material for the semiconductor substrate 10 can be selected from among Si, Ge, SiGe, GaAs, AlGaAs, InP, GaP, InGaAs, Gab, and SiC, for example. The memory cell arrays 2 and 3 illustrated in FIG. 10 can be arranged in the cell array region R1, and the peripheral circuit illustrated in FIG. 10 can be arranged in the peripheral region R2.

An element isolation layer 11 is formed on the semiconductor substrate 10. The element isolation layer 11 can isolate elements from each other in the cell array region R1 and the peripheral region R2. The element isolation layer 11 may have a STI (shallow trench isolation) structure, for example. The material for the element isolation layer 11 may be $SiO_2$, for example.

In the cell array region R1, an N well NW0 is formed on the semiconductor substrate 10, and a P well PW0 is formed on the N well NW0. Floating gate electrodes 15 and select gate lines SGS and SGD are arranged on the P well PW0. Control gate electrodes 16 are formed on the floating gate electrodes 15 to form word lines WL1 to WLh. In this example, one floating gate electrode 15 on the P well PW0 and one control gate electrode 16 on the floating gate electrode 15 can form one memory cell.

An N-type impurity diffused layer 12 is formed on the P well PW0 between the floating gate electrodes 15 or between the floating gate electrodes 15 and the select gate lines SGS and SGD. An N-type impurity diffused layer 13 is formed at one side of the select gate line SGD, and an N-type impurity diffused layer 14 is formed at one side of the select gate line SGS.

The N-type impurity diffused layer 13 is connected to a bit line BL via a contact electrode 18, and the N-type impurity diffused layer 14 connected to a source line SCE via a contact electrode 17. The control gate electrodes 16 in each memory cell are connected to the word lines WL1 to WLh.

A P-type impurity diffused layer 23 is formed at the periphery of the P well PW0, and an N-type impurity diffused layer 24 is formed at the periphery of the N well NW0. A P-type impurity diffused layer 27 is formed on the semiconductor substrate 10. The impurity diffused layers 23 and 24 are connected to a wire H13 via contact electrodes 19 and 20, respectively. The P-type impurity diffused layer 23 can constitute a guard ring of the P well PW0, the N-type impurity diffused layer 24 can constitute a guard ring of the N well NW0, and the P-type impurity diffused layer 27 can constitute a guard ring of the semiconductor substrate 10.

In the peripheral region R2, a gate electrode GH is arranged on the semiconductor substrate 10. N-type impurity diffused layers 25 and 26 are formed on the semiconductor substrate 10 to sandwich a channel region under the gate electrode GH. The N-type impurity diffused layer 25 is connected to a wire H14 via a contact electrode 21, and the wire H14 is connected to the bit line BL via a contact electrode 28. The N-type impurity diffused layer 26 is connected to a wire H15 via a contact electrode 22, and the wire H15 is connected to a wire H11 via a contact electrode 29.

The diameters of the contact electrodes 21 and 22 can be larger than the diameters of the contact electrodes 17 and 18. The contact electrodes 17 and 18 can be formed by embedding conductors into the post-process pattern T1 illustrated in FIG. 10. The contact electrodes 21 and 22 can be formed by embedding conductors into the post-process pattern T2 illustrated in FIG. 1D. Hole patterns in which the contact electrodes 17, 18, 21, and 22 are to be embedded can be formed by the same lithographic process. In this example, the shape of the exposure light can be set such that the surface shapes of the contact electrodes 17 and 18 are circles or ovals. Even when the shape of the exposure light is set such that the surface shapes of the contact electrodes 17 and 18 are circles or ovals, the mask pattern verification device 51 illustrated in FIG. 1A can be used to prevent the surface shapes of the contact electrodes 21 and 22 from becoming angular shapes such as rectangles or lozenges, thereby improving the contact electrodes 21 and 22 in embedding property.

When the same lithographic process is applied to form bit contacts in the memory cell arrays of the NAND flash memory and source/drain contacts in the peripheral circuit, the mask pattern verification device 51 illustrated in FIG. 1A can be used to verify the hole patterns for the source/drain contacts. At that time, the shapes of the bit contacts and the source/drain, contacts may be circles or ovals. The diameter of the bit contacts can be 50 nm or less, and the diameter of the source/drain contacts can be 100 nm or more.

Alternatively, when the same lithographic process is applied to form word contacts in the memory cell arrays of the NAND flash memory and gate contacts in the peripheral circuit, the mask pattern verification device 51 illustrated in FIG. 1A may be used to verify hole patterns for the gate contacts.

Eighth Embodiment

Figure 12:
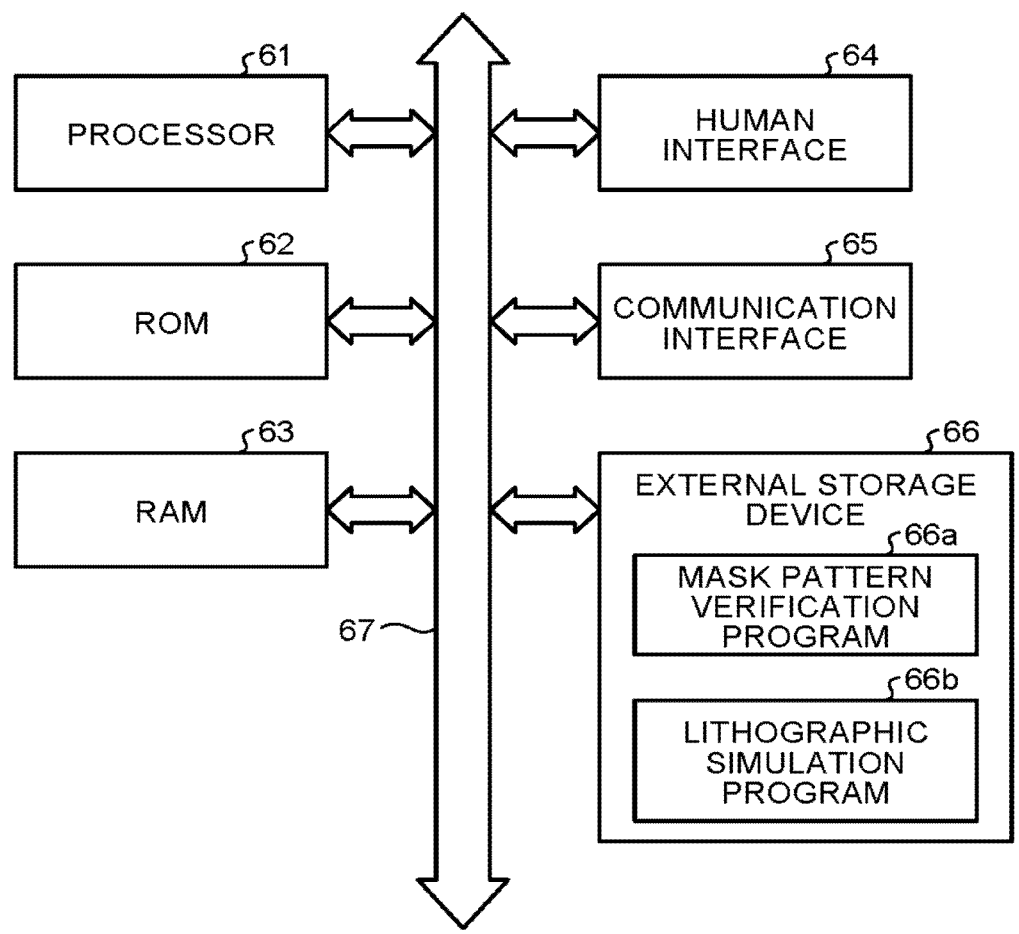
FIG. 12 is a block diagram illustrating a hardware configuration of a mask pattern verification device according to an eighth embodiment.

FIG. 12 is a block diagram illustrating a hardware configuration of a mask pattern verification device according to an eighth embodiment.

Referring to FIG. 12, the mask pattern verification device can be provided with a processor 61 including a CPU and the like, a ROM 62 storing fixed data, a RAM 63 providing a work area for the processor 61, a human interface 64 that intermediates between humans and computers, a communication interface 65 that provides a means of communication with the outside, and an external storage device 66 that stores programs and various data for operating the processor 61. The processor 61, the ROM 62, the RAM 63, the human interface 64, the communication interface 65, and the external storage device 66 are connected to one another via a bus 67.

The external storage device 66 can be a magnetic disc such as a hard disc, an optical disc such as a DVD, or a mobile semiconductor storage device such as a USB memory or a memory card. The human interface 64 can be a keyboard, a mouse, or a touch panel as an input interface, and can be a display or a printer as an output interface, for example. The communication interface 65 can be a LAN card, a modem, or a router for connection with the internet or a LAN, for example. The external storage device 66 has a mask pattern verification program 66a for verifying a mask pattern installed therein. The mask pattern verification program 66a can implement on a computer the functions of the inscribed figure calculation unit 51a, the differential calculation unit 51b, and the specification determination unit 51c illustrated in FIG. 1A. The external storage device 66 may have a lithographic simulation program 66b installed therein. The lithographic simulation program 66b can implement the lithographic simulator 55 illustrated in FIG. 1A. When the mask pattern verification program 66a is executed by the processor 61, it is determined whether the rectangular pattern of the designed layout data satisfies a predetermined specification.

The mask pattern verification program 66a to be executed by the processor 61 may be stored in the external storage device 66 and read in the RAM 63 at the time of execution of the program. The mask pattern verification program 66a may be stored in advance in the ROM 62 or may be acquired via the communication interface 65. The mask pattern verification program 66a may be executed on a stand-alone computer or a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask pattern verification method by mask pattern verification circuitry, the method comprising:
   receiving, by the circuitry, designed layout data for generating a mask pattern of a photomask that is used to pattern a resist film applied on a substrate of a semiconductor device for manufacturing the semiconductor device by optical lithography;
   calculating, by the circuitry, an inscribed figure as a circle or an oval inscribed in a rectangular pattern of the received designed layout data;
   calculating, by the circuitry, an optical lithographic shape that corresponds to the rectangular pattern and a resist pattern being formed on the resist film;

calculating, by the circuitry, a difference in area between the optical lithographic shape and the inscribed figure; and determining, by the circuitry, for verifying the mask pattern, whether the difference in area satisfies a predetermined specification.

2. The mask pattern verification method of claim 1, wherein
the optical lithographic shape is calculated by the circuitry using an optical lithographic simulation.

3. The mask pattern verification method of claim 2, wherein
the rectangular pattern includes:
a first rectangular pattern; and
a second rectangular pattern larger in area than the first rectangular pattern, and
in the optical lithographic simulation, when the shape of illumination is set to obtain a desired shape for the first rectangular pattern, an optical lithographic shape for the second rectangular pattern is calculated by the circuitry.

4. The mask pattern verification method of claim 1, wherein
the optical lithographic shape is calculated by the circuitry after a proximity effect correction to the rectangular pattern is executed by the circuitry.

5. The mask pattern verification method of claim 1, wherein
the calculating of the optical lithographic shape is executed using auxiliary patterns applied to a periphery of the rectangular pattern, and
when the difference in area does not satisfy the predetermined specification, the positions, sizes, or shapes of the auxiliary patterns are changed by the circuitry.

6. The mask pattern verification method of claim 5, wherein
the positions, sizes, or shapes of the auxiliary patterns are changed by the circuitry based on areas divided by line segments linking the center of the inscribed figure and the centers of the auxiliary patterns.

7. The mask pattern verification method of claim 1, wherein
when the optical lithographic shape is arranged in contact with the inscribed figure at four points, differences among four areas corresponding to the four corners of the optical lithographic shape are calculated by the circuitry.

8. The mask pattern verification method of claim 1, wherein
when the optical lithographic shape is arranged in contact with the inscribed figure at three points and the optical lithographic shape resides inside the inscribed figure, the area between the optical lithographic shape and the inscribed figure is divided, and four areas corresponding to the four corners of the optical lithographic shape are calculated by the circuitry.

9. The mask pattern verification method of claim 1, wherein
when the optical lithographic shape is arranged in contact with the inscribed figure at three points and the optical lithographic shape extends off the inscribed figure, the extended portion of the optical lithographic shape is removed and four areas corresponding to the four corners of the optical lithographic shape are calculated by the circuitry.

10. A manufacturing method of a semiconductor device, comprising:

receiving designed layout data for generating a mask pattern of a photomask that is used to pattern a resist film applied on a substrate of a semiconductor device for manufacturing the semiconductor device by optical lithography;

calculating an inscribed figure as a circle or an oval inscribed in a rectangular pattern of the received designed layout data;

calculating an optical lithographic shape that corresponds to the rectangular pattern and a resist pattern being formed on the resist film;

calculating a difference in area between the optical lithographic shape and the inscribed figure;

determining whether the difference in area satisfies a predetermined specification;

when the difference in area satisfies the predetermined specification, performing optical lithography of a resist film on a processing film on a semiconductor substrate based on a mask pattern corresponding to the designed layout data; and treating the processing film based on a resist pattern obtained by the optical lithography.

11. The manufacturing method of a semiconductor device of claim 10, wherein
a hole pattern corresponding to the rectangular pattern is formed on the resist film by the optical lithography.

12. The manufacturing method of a semiconductor device of claim 11, wherein
the rectangular pattern includes:
a first rectangular pattern; and
a second rectangular pattern larger in area than the first rectangular pattern, and
when the shape of illumination in the optical lithography is set to obtain a hole pattern for the first rectangular pattern, the predetermined specification is set such that a hole pattern is obtained for the second rectangular pattern.

13. The manufacturing method of a semiconductor device of claim 10, wherein
the optical lithographic shape is calculated by an optical lithographic simulation.

14. The manufacturing method of a semiconductor device of claim 10, wherein
the optical lithographic shape is calculated after execution of a proximity effect correction to the rectangular pattern.

15. The manufacturing method of a semiconductor device of claim 10, wherein
the calculating of the optical lithographic shape is executed using auxiliary patterns applied to a periphery of the rectangular pattern, and
when the difference in area does not satisfy the predetermined specification, the positions, sizes, or shapes of the auxiliary patterns are changed.

16. A non-transitory computer-readable storage medium storing a mask pattern verification program for causing a computer to:

receive designed layout data for generating a mask pattern of a photomask that is used to pattern a resist film applied on a substrate of a semiconductor device for manufacturing the semiconductor device by optical lithography;

calculate an inscribed figure as a circle or an oval inscribed in a rectangular pattern of the received designed layout data;

calculate an optical lithographic shape that corresponds to the rectangular pattern and a resist pattern being formed on the resist film;

calculate a difference in area between the optical lithographic shape corresponding to the rectangular pattern and the inscribed figure; and determine, for verifying the mask pattern, whether the difference in area satisfies a predetermined specification.

17. The non-transitory computer-readable storage medium of claim 16, wherein
the computer is caused to calculate the optical lithographic shape by an optical lithographic simulation.

18. The non-transitory computer-readable storage medium of claim 16, wherein
the rectangular pattern includes:
a first rectangular pattern; and
a second rectangular pattern larger in area than the first rectangular pattern, and
in the optical lithographic simulation, when the shape of illumination is set to obtain a desired shape for the first rectangular pattern, an optical lithographic shape for the second rectangular pattern is calculated.

19. The non-transitory computer-readable storage medium of claim 16, wherein
the computer is caused to calculate the optical lithographic shape after being caused to execute a proximity effect correction to the rectangular pattern.

20. The non-transitory computer-readable storage medium of claim 16, wherein
the calculating of the optical lithographic pattern is executed using auxiliary patterns applied to a periphery of the rectangular pattern, and the computer is caused to, when the difference in area does not satisfy the predetermined specification, change the positions, sizes, or shapes of the auxiliary patterns.

* * * * *